United States Patent
Stein et al.

(10) Patent No.: US 8,537,044 B2
(45) Date of Patent: Sep. 17, 2013

(54) INTERLEAVED ANALOG TO DIGITAL CONVERTER WITH DIGITAL EQUALIZATION

(71) Applicant: Guzik Technical Enterprises, Mountain View, CA (US)

(72) Inventors: Anatoli B. Stein, Atherton, CA (US); Semen P. Volfbeyn, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 13/730,071

(22) Filed: Dec. 28, 2012

(65) Prior Publication Data
US 2013/0169463 A1    Jul. 4, 2013

Related U.S. Application Data

(60) Provisional application No. 61/580,924, filed on Dec. 28, 2011.

(51) Int. Cl.
*H03M 1/12* (2006.01)
(52) U.S. Cl.
USPC ............................................ 341/155; 341/120
(58) Field of Classification Search
USPC ................. 341/155, 120, 118, 159, 141, 122; 375/229
See application file for complete search history.

(56) References Cited

U.S. PATENT DOCUMENTS

| | | | |
|---|---|---|---|
| 5,239,299 A | 8/1993 | Apple et al. | |
| 7,233,270 B2 * | 6/2007 | Lin | 341/118 |
| 7,245,638 B2 * | 7/2007 | Agazzi et al. | 370/516 |
| 7,394,415 B2 * | 7/2008 | Fuse et al. | 341/120 |
| 7,408,495 B2 * | 8/2008 | Stein et al. | 341/155 |
| 7,782,235 B1 * | 8/2010 | Velazquez | 341/118 |
| 2005/0151679 A1 | 7/2005 | Adams | |
| 2010/0182174 A1 | 7/2010 | Johansson et al. | |

* cited by examiner

*Primary Examiner* — Peguy Jean Pierre
(74) *Attorney, Agent, or Firm* — Pierce Atwood LLP; Joseph M. Maraia

(57) ABSTRACT

An interleaved analog to digital converter with digital equalization includes a conversion-measurement-equalization unit and residual distortions reduction unit, and is operative in a calibration mode and converter mode. The conversion-measurement-equalization unit includes a composite ADC containing N sub-ADCs, equalizer, responses measurement unit and a coefficients calculator. The residual distortions reduction unit uses received measured frequency responses and equalizer coefficients, both from the conversion-measurement-equalization unit, as a base to calculate corrected frequency responses that are applied to the coefficients calculator for generation of equalizer coefficients for application to the equalizer. A residual distortions calculator of the residual distortions reduction unit, is responsive to measured frequency responses from the composite ADC and a current set of equalizer coefficients applied to the equalizer, to calculate residual frequency distortions that should have been expected to appear in the output signal of the ADC system if the current equalizer coefficients remain applied to the equalizer.

4 Claims, 4 Drawing Sheets

INTERLEAVED ANALOG TO DIGITAL CONVERTER WITH DIGITAL EQUALIZATION

RELATED APPLICATION(S)

This application is related to U.S. Provisional Patent Application Ser. No. 61/580,924, filed Dec. 28, 2011, entitled Interleaved Analog to Digital Converter with Digital Equalization, incorporated by reference herein.

FIELD

The invention relates to high speed analog-to-digital converters (ADCs) and, more particularly, to digital equalization of analog-to-digital conversion systems with an ADC that consists of a plurality of time interleaved sub-ADCs.

BACKGROUND

An increase in the sampling rate of analog-to-digital conversion may be achieved by the use of composite ADCs. A composite ADC contains a number of interleaved sub-ADCs with a common input and a sequential timing. If the number of sub-ADCs equals N, then the resulting conversion rate is N times larger than the rate of one sub-ADC.

Each sub-ADC incorporated in a composite ADC has its own amplitude frequency response $Amp[i, k]$ and phase frequency response $Phs[i, k]$ (where i is the number of the sub-ADC, $0 \leq i < N$, and k is the number of a test frequency at which the responses were measured). The amplitude frequency response and phase frequency response of the different sub-ADCs are not identical. The differences arise because of deviations in the frequency responses of input signal distributing circuitry and/or responses of analog front ends of the respective sub-ADCs (input amplifiers, track-and-hold circuits, etc.). These differences are inevitable, given current design practices and process technology variations. On the other hand, the misalignment of sub-ADCs frequency responses causes specific signal distortions, with the appearance of spurious frequency components being of prime importance.

The main way to prevent the appearance of the specific distortions in a composite ADC, is to use equalization of its output digital signal. There are several prior art patents concerned with digital equalization of composite an ADC output signal, for example U.S. Pat. No. 5,239,299, U.S. Pat. No. 7,408,495, US Patent Application Publication Nos. US2005/0151679, US2010/0182174, and others. It is possible to carry out equalization of each sub-ADC output signal before interleaving those signals. Such an approach is described in U.S. Pat. No. 5,239,299. Another equalization strategy, with an equalizer processing the aggregate digital signal (after the sub-ADC output signals are interleaved), is suggested in U.S. Pat. No. 7,408,495 and in US Patent Application Publication No. US 2005/0151679.

An equalizer should correct frequency responses of different sub-ADCs in such a way as to eliminate (or at least to reduce) the impact of their divergence on the processed signal, and prevent the rise of correspondent distortions. Furthermore, the equalizer forms the transfer function of the analog to digital conversion system as a whole, in accordance with the predetermined target transfer function (or, what is the same, with the target amplitude frequency response $AmpT[k]$ and target phase frequency response $PhsT[k]$).

The digital signal at the output of the equalizer may be considered as a combination of N partial signals, the i-th partial signal comprising samples that were created in the sub-ADC with the number i. If a sine wave with a unit amplitude is applied to the input of the composite ADC, then the partial signals are sine waves too, having the amplitudes $AmpOut[i, k]$ and phases $PhsOut[i, k]$. Had the equalizer be loaded with an ideal assembly of coefficients, the amplitudes $AmpOut[i, k]$ and phases $PhsOut[i, k]$ would be the same as the target amplitude frequency response $AmpT[k]$ and target phase frequency response $PhsT[k]$. In reality, the equalizer coefficients are different from the ideal coefficients, and the frequency responses of the analog to digital conversion system deviate from the target frequency responses. The deviations may be considered as residual frequency distortions, $AmpRes[i, k]$ and $PhsRes[i, k]$, respectively.

The value of the residual frequency distortions indicates the grade of equalizer performance: the better the equalization, the less are the residual frequency distortions (evaluation of the distortions may be done by their maximum absolute value, or by a root mean square value with the averaging over sub-ADCs number i).

How accurately the frequency distortions of the composite ADC are compensated depends on the validity of an equalizer coefficients calculation. At each sampling interval, the equalizer processes a sample that comes from one of the sub-ADCs of the composite ADC. Different sets of equalizer coefficients are used to correct samples coming from different sub-ADCs, so that the assembly of the coefficients forms a two dimensional array $C[i, m]$, where i is the set number (the same as the number of the corresponding sub-ADC), and m is the number of the equalizer tap (the number of a coefficient in a set).

When an equalizer is used to correct frequency distortions in a time invariant device that can be described by a single pair of amplitude and phase frequency responses, the procedure of the equalizer coefficients calculation is simple enough: the required equalizer frequency responses are found as complementary to the device frequency distortions, and the equalizer coefficients are calculated using an inverse discrete Fourier transform of the required equalizer frequency responses. The set of coefficients found in that way provides absolutely accurate correction of the frequency distortions (at least in theory).

When the equalization of a composite ADC is concerned, the situation is quite different. A composite ADC is a time variant device: at each sampling interval its frequency responses depend on the frequency responses of the sub-ADC being used at that instant. To correct the next sample, the equalizer (located after the composite ADC) uses as a correction addition, a linear combination of the adjacent samples and the equalizer coefficients. However, each adjacent sample is created in a sub-ADC that is different from the sub-ADC that created the sample to be corrected. For this reason, the correction addition differs from the proper value, giving rise to an equalization error. To ensure an accurate compensation of frequency distortions of a composite ADC, each set of equalizer coefficients $C[i, m]$ for a certain i should be calculated taking into account not only the frequency responses of the sub-ADC with the same number I, but the frequency responses of other sub-ADCs as well.

In the U.S. Pat. No. 5,239,299, it is proposed during equalization of a composite ADC, to calculate the equalizer coefficients by measuring the differential variation among the amplitude and phase frequency responses of different sub-ADCs, transforming the frequency responses to the Z domain, and inverting the received matrix of Z polynomials. In the U.S. Pat. No. 7,408,495, it is suggested to calculate the equalizer coefficients by performing inverse discrete Fourier transform of preliminary measured frequency responses of different sub-ADCs. Both approaches are mathematically equivalent, and both suffer from the same disadvantage: the equalizer coefficients are calculated with an error due to the fact that the set of equalizer coefficients corresponding to one sub-ADC is calculated without taking in account the distortions of other sub-ADCs frequency responses.

In the U.S. Pat. No. 7,408,495, an analog to digital conversion system was proposed, where the equalization error due to imperfect equalizer coefficients calculation was eliminated by measuring the amplitude and phase of the partial signals in the equalizer output digital signal anew, and determining in that way, the residual frequency distortions, AmpRes[i, k] and PhsRes[i, k]. After that, the determined residual frequency distortions were used to correct the equalizer coefficients assembly. A difficulty with such an analog to digital conversion system is that the repeated measurement of frequency distortions extends excessively the duration of the calculations. This being so, makes it impractical to use the proposed system in devices where prompt target change is required.

A different method of equalizer coefficients calculation, based on the least square approximation, is described in the US Patent Application Publication No. US 2010/0182174. That method eliminates a reason for the above described equalization errors. However, the implementation of an analog to digital conversion system with such procedure of equalizer coefficients calculation, requires numerical computation of integrals and inversion of a large matrix that is often nearly singular. The needed computational resources turn out to be too big, so that the possibility to use this method of equalizer coefficients calculation in real devices becomes doubtful. Again, time of calculations, while using that method, is too lengthy, and makes difficult fast change of equalizer performance characteristics.

The considerations presented above show that an equalization system for an improved interleaved analog to digital converter is needed, which does not require a prohibitive amount of resources for implementation, permits a prompt change of requested specifications (an most importantly, permits a prompt change of target frequency responses), and is not impaired by equalization errors due to imperfect calculation of equalizer coefficients.

SUMMARY

An interleaved analog to digital converter with digital equalization is disclosed, having a conversion-measurement-equalization unit and a residual distortions reduction unit. The conversion-measurement-equalization unit is operative in a calibration mode and an operational mode.

In the operational mode, the conversion-measurement-equalization unit (i) converts an applied analog signal into a digital signal by the use of a interleaved composite ADC consisting of N sub-ADCs, (ii) corrects sub-ADCs misalignments as well as deviations from target frequency responses, by the use of a digital equalizer and (iii) applies an equalizer output signal at the digital output of the conversion-measurement-equalization unit. In the calibration mode, the conversion-measurement-equalization unit (i) performs frequency responses measurement of each sub-ADC and yields the measurement results on a measured frequency responses output, (ii) transforms the corrected frequency responses received at its corrected frequency responses input into a set of equalizer coefficients, (iii) puts the equalizer coefficients at the equalizer coefficients output, and (iv) loads the coefficients into a digital equalizer memory;

The residual distortions reduction unit is responsive to the measured frequency responses output and to the equalizer coefficients output, of the conversion-measurement-equalization unit, pursuant to a set of successive iterations, to generate a corrected frequency responses output. The corrected frequency responses output is coupled to the coefficients calculator of the conversion-measurement-equalization unit where it is used to determine an updated set of coefficients to be applied to the equalizer.

In a form, the residual distortions reduction unit includes (i) a residual distortions calculator and (ii) a distortions modification unit. The residual distortions calculator is operative to calculate the residual frequency distortions that should have been expected to appear in the output signal of the overall analog to digital converter, if a current coefficients set had been loaded into the equalizer.

The distortions modification unit is operative in all iterations except the zero iteration. In response to measured frequency responses and a residual distortions input, the distortions modification unit generates modified/corrected frequency responses for application to coefficients calculator of the conversion-measurement-equalization unit during all but the zero iteration. In the zero iteration, the measured frequency responses are applied to the coefficients calculator.

In a form, the residual distortions calculator includes an amplitude-phase to real-imaginary parts converter, a coefficients multiplication unit, a FIRs unit, and a real-imaginary parts to amplitude-phase converter.

The amplitude-phase to real-imaginary parts converter is operative to transform the amplitude and phase frequency distortions of each sub-ADC into the real part and the imaginary part of the frequency distortions complex amplitude of the same sub-ADC. The amplitude-phase to real-imaginary parts converter has an input that is used as the distortions input of the residual distortions calculator and an output.

In a form, the coefficients multiplication unit is operative to produce sine multiplied equalizer coefficients and cosine multiplied equalizer coefficients. The coefficients multiplication unit has an input that is used as the current coefficients input of the residual distortions calculator and an output.

In a form, the FIRs unit is operative to produce the real part and the imaginary part of the residual distortions complex amplitude. The FIRs unit has a distortions input, a multiplied coefficients input and an output, where the distortions input of the FIRs unit is connected to the output of the amplitude-phase to real-imaginary parts converter and the multiplied coefficients input of the FIRs unit is connected to the output of the coefficients multiplication unit;

In a form, the real-imaginary parts to amplitude-phase converter is operative to transform the real part and the imaginary part of the residual distortions complex amplitude into the residual frequency distortions that should have been expected to appear in the output signal of the overall analog to digital converter, if a current coefficients set had been loaded into the equalizer. The real-imaginary parts to amplitude-phase converter has an input that is connected to the output of the FIRs unit, and an output that is used as the output of the residual distortions calculator.

In a form, the distortions modification unit includes a modifier, a memory and a switch.

The modifier is operative to produce modified frequency distortions of the sub-ADCs to be used as a basis for equalizer coefficients calculation. The modifier has a residual distortions input, a previously modified distortions input and an output. The residual distortions input of the modifier is used as the distortions input of the distortions modification unit, and the output of the modifier is used as the output of the distortions modification unit.

The memory is operative to store the modified frequency distortions of the sub-ADCs produced in a previous iteration.

The memory has a write input, and a read output that is connected to the previously modified distortions input of the modifier.

The switch is operative to connect the write input of the memory to the distortions input of the distortions modification unit at the zero iteration, and to the output of the modifier during all other iterations.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

Figure 2:
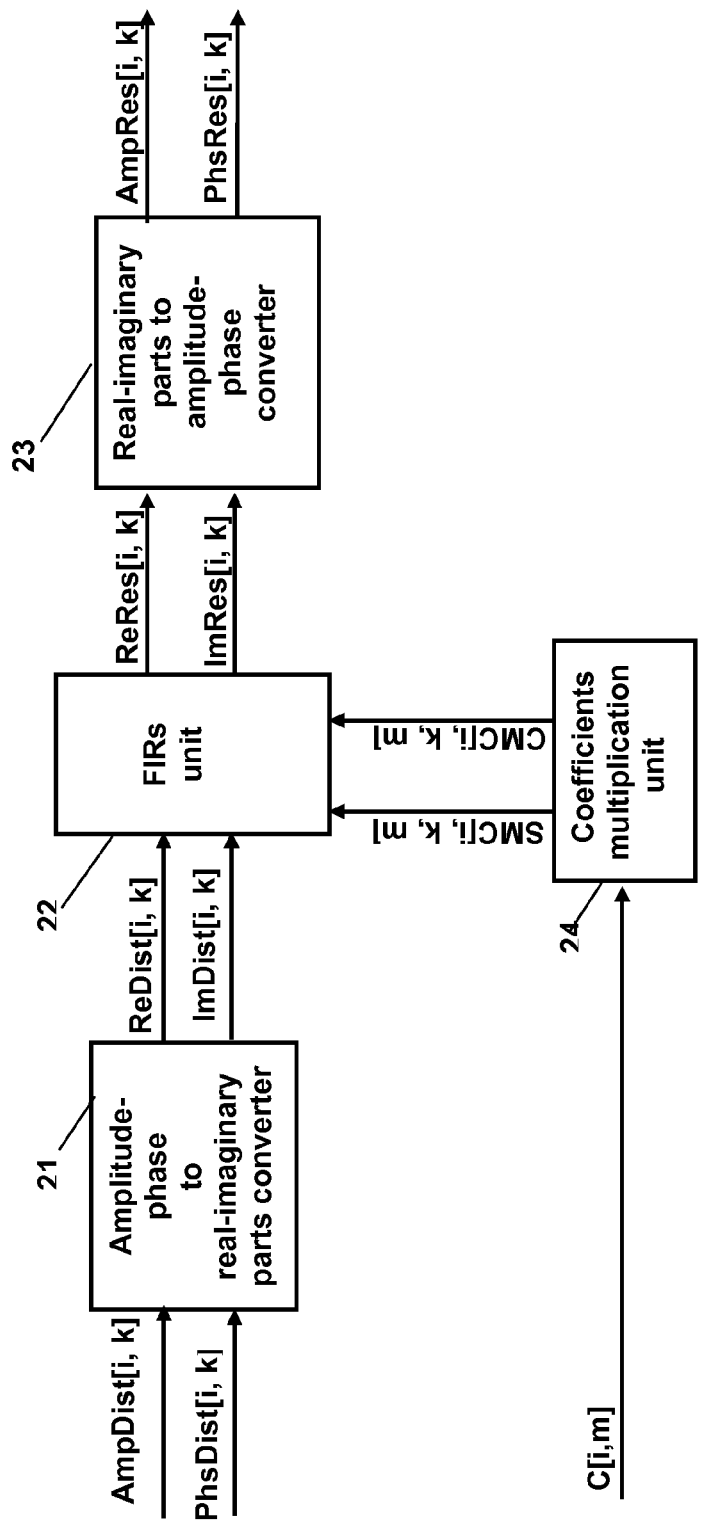

The FIG. 2 shows the block diagram of the residual distortion calculator 18 in accordance with the present invention.

Figure 3:
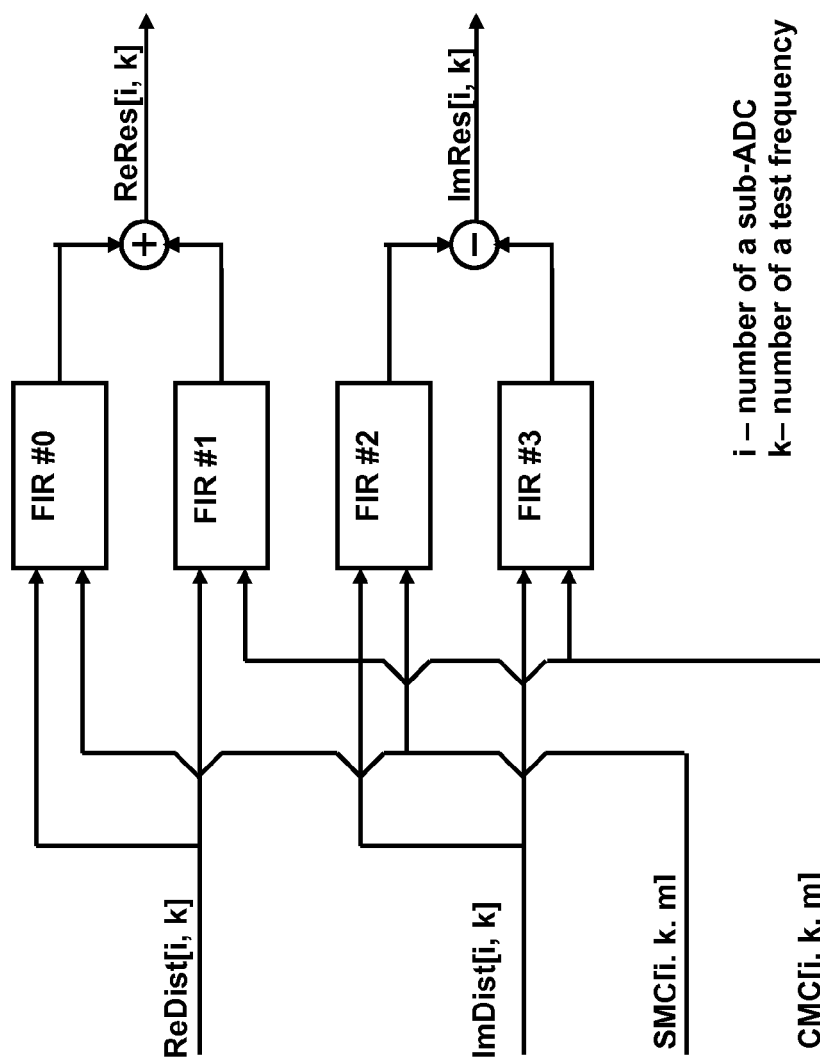

The block diagram of the FIRs unit 22 in accordance with the present invention is shown in the FIG. 3.

Figure 4:
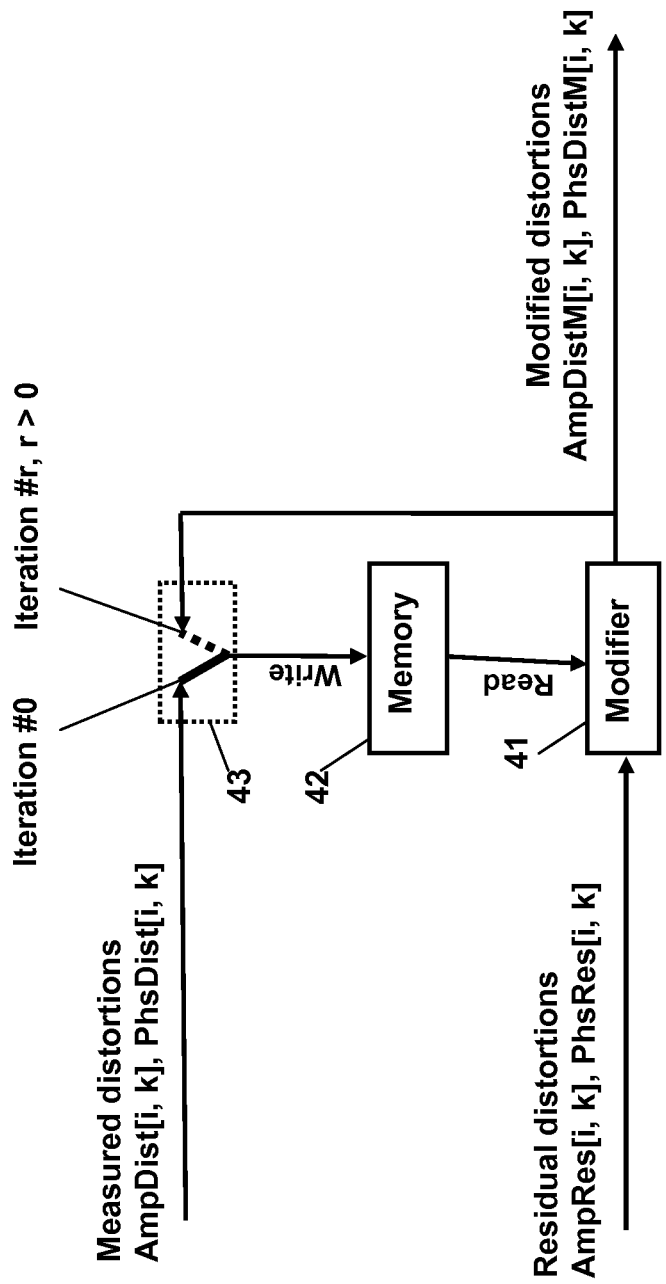

The block diagram of the distortions modification unit 19 in accordance with the present invention is shown in the FIG. 4.

DETAILED DESCRIPTION

Figure 1:
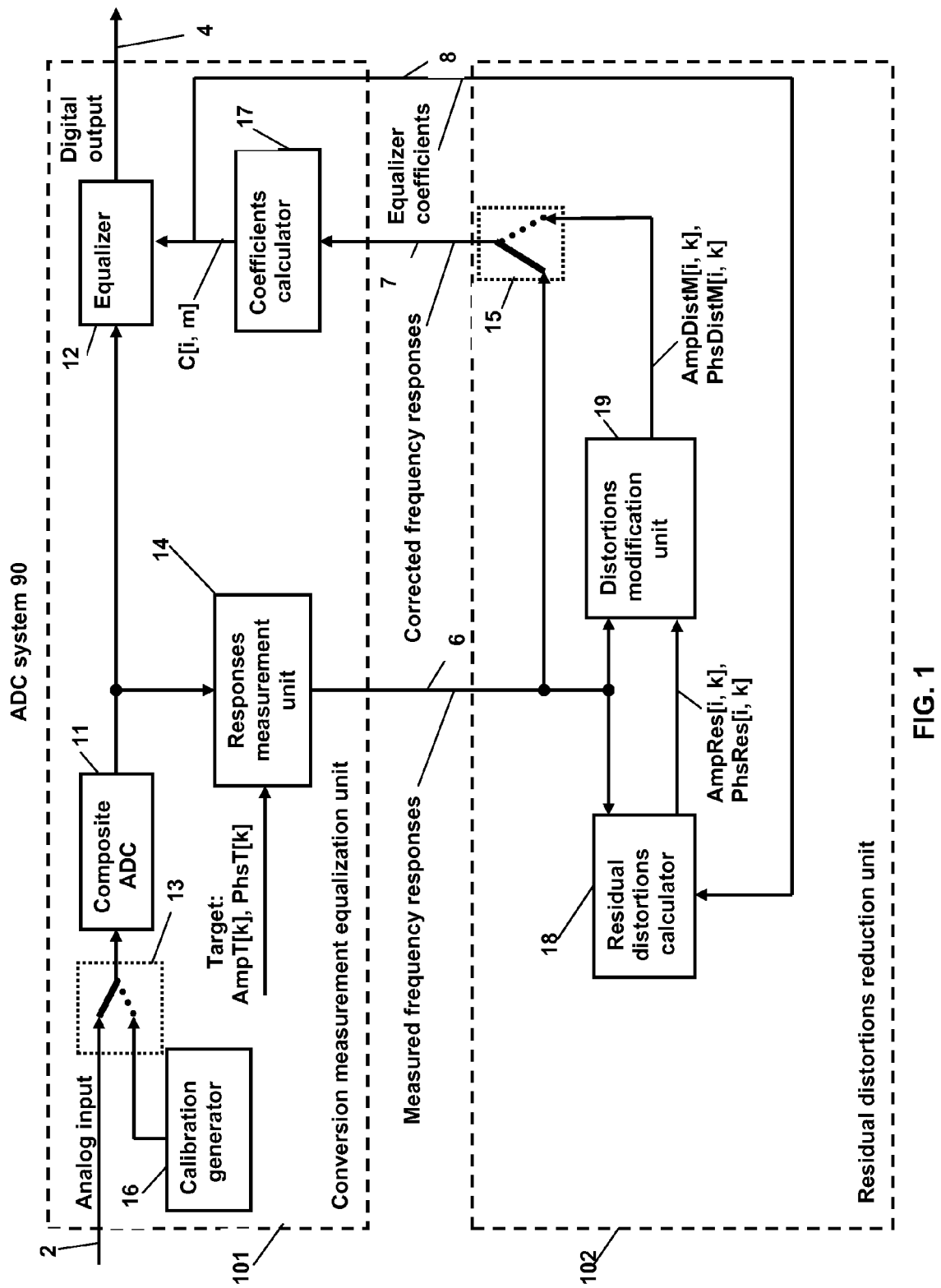
FIG. 1 shows a block diagram of an interleaved analog to digital converter with digital equalization in accordance with an embodiment of the present invention.

FIG. 1 shows a block diagram of an interleaved analog to digital converter with digital equalization (ADC system 90) in accordance with an exemplary embodiment of the present invention. ADC system 90 comprises a conversion-measurement-equalization unit 101 and a residual distortions reduction unit 102.

In a form, the conversion-measurement-equalization unit 101 corresponds to functional elements of a conventional interleaved digital to analog converter. Unit 101 is operative in a calibration mode and a converter mode.

The conversion-measurement-equalization unit 101 has an analog input 2, a digital output 4, a measured frequency responses output 6, a corrected frequency responses input 7 and an equalizer coefficients output 8. The analog input 2, is adapted to receive an applied analog input signal to be converted to a digital signal by the ADC system 90, and the digital output 4 provides the digital output signal of the ADC system 90, corresponding to a digitized form of the analog signal applied to analog input 2.

The conversion-measurement-equalization unit 101 includes a composite ADC 11 containing N sub-ADCs, an equalizer 12, a switch 13, a calibration generator 16, a responses measurement unit 14 and a coefficients calculator 17.

The residual distortions reduction unit 102 uses received measured frequency responses (from unit 101) and equalizer coefficients (from unit 101) as a base to calculate corrected frequency responses that are applied to the coefficients calculator 17 of unit 101 for generation of equalizer coefficients for application to equalizer 12.

The residual distortions reduction unit 102 has a measured frequency responses input connected to the measured frequency responses output 6 of unit 101, an equalizer coefficients input connected to the equalizer coefficients output 8 of unit 101 and a corrected frequency responses output connected to the frequency responses input 7 of unit 101.

The residual distortions reduction unit 102 includes a residual distortions calculator 18, a distortions modification unit 19, and an iteration switch 15.

The residual distortions calculator 18 is responsive to measured frequency responses from composite ADC 11 and a current set of equalizer coefficients applied to equalizer 12, to calculate residual frequency distortions that should have been expected to appear in the output signal of the ADC system 90 if the current equalizer coefficients remain applied to the equalizer 12.

The distortions modification unit 19 calculates corrected frequency responses to be used as a basis for calculation of equalizer coefficients by calculator 17.

The iteration switch 15 connects the measured frequency responses input (from responses measurement unit 14 of unit 101), or the output of the distortions modification unit 19, to the frequency responses input 7 of unit 101, depending on the position of the iteration switch 15.

The conversion-measurement-equalization unit 101 is operative in a calibration mode or an operational mode, In the operational mode, the switch 13 is in its upper (as illustrated in FIG. 1) position, so that an analog signal applied to analog input 2, passes to an input of the composite ADC 11. The composite ADC 11 converts the analog input signal into a digital signal and transfers that digital signal to the input of equalizer 12. The equalizer 12 processes that transferred digital signal (based on the then-applied coefficients from coefficients calculator 17), correcting the frequency responses of the composite ADC 11 components, and forms the output digital signal on digital output 4.

In the calibration mode, the switch 13 is in its lower (as illustrated in FIG. 1) position, so that the output of the calibration generator 16 is connected to the input of the composite ADC 11. The calibration generator 16 generated a succession of sine wave signals, which are applied to the N sub-ADCs incorporated into the composite ADC 11. The purpose of calibration mode is to determine a set of coefficients for loading into the equalizer 12, to ensure correction of the frequency responses of the N sub-ADCs incorporated into the composite ADC 11 with a sufficient degree of accuracy. The accurate correction manifests itself as a good enough agreement between the frequency responses of the interleaved analog to digital converter with digital equalization as a whole, and an applied target (desired) frequency responses AmpT[k], PhsT[k].

During the calibration procedure, the responses measurement unit 14, inherently interacting with the calibration generator 16, provides a measurement of the amplitude frequency response Amp[i, k] and phase frequency response Phs[i, k] of each sub-ADC with the number i, $0<i\leq N$. The signals from the output of the calibration generator 16 passes through the mode selection switch 13, to the input of the composite ADC 11. The ADC 11 converts received sine waves into sequences of digital samples, which proceed from the output of the composite ADC 11 to the input of the responses measurement unit 14. A detector, incorporated in the responses measurement unit 14, measures the amplitude and the phase of each partial digital signal from corresponding subADCs which is contained in the output signal of the composite ADC 11. In that way, the amplitude and phase frequency responses Amp[i, k], Phs[i, k] of each sub-ADC with the number i are obtained.

More particularly, the responses measurement unit 14 compares the frequency responses Amp[i, k], Phs[i, k] from composite ADC 11, with pre-specified target frequency responses for ADC system 90, AmpT[k], PhsT[k], and determines the frequency distortions, AmpDist[i, k], PhsDist[i, k], by performing the correspondent mathematical operations for all and k:

AmpDist $[i,k]$=Amp$[i,k]$/Amp$T[k]$,

PhsDist $[i,k]$=Phs$[i,k]$−Phs$T[k]$.

The arrays AmpDist [i, k] and PhsDist [i, k] are transferred by way of an output of responses measurement unit 14, to the measured frequency responses output 6 of the conversion-measurement-equalization unit 101.

After the responses measurement unit 14 finishes determination of the frequency distortions AmpDist[i, k] and PhsDist [i, k], the process of the equalizer coefficients calculation begins. According to the present invention, the calculation of the equalizer coefficients is done as a sequence of successive iterations, each iteration producing a more close approximation to the sought set of equalizer coefficients. The calculation of the equalizer coefficients is carried out by the coefficients calculator 17 of the conversion-measurement-equalization unit 101 together with the residual distortions reduction unit 102.

At iteration #0, the iteration switch 15 is put into the upper (as illustrated in FIG. 1) position. The respective measured frequency distortions AmpDist[i, k] and PhsDist[i, k] are transferred from the output of the responses measurement unit 14 to the input of the coefficients calculator 17 to be used as a basis for the equalizer coefficients calculation. The coefficients calculator 17 converts the frequency distortions AmpDist[i, k] and PhsDist[i, k] into a set of equalizer coefficients C[i, m] and places these coefficients at its output.

During each of the following iterations with the number r, where r>0, the previously found equalizer coefficients C[i, m] are transferred from the output of the coefficients calculator 17 to the coefficients input of the residual distortion calculator 18. The arrays of frequency distortions AmpDist[i, k], PhsDist[i, k] are transferred from the output of the responses measurement unit 14 to the distortions input of the residual distortion calculator 18. The residual distortion calculator 18 analyzes the coefficients C[i, m], together with the frequency distortions AmpDist[i, k], PhsDist[i, k], and determines the residual amplitude distortions AmpRes[i, k] and the residual phase distortions PhsRes[i, k], that would appear in the digital signal at the output of the interleaved analog to digital converter with digital equalization, if the coefficients C[i, m] had been loaded into the equalizer 12.

The calculated residual distortions are transferred from the output of the residual distortion calculator 18 to the first input of the distortions modification unit 19. The arrays of measured frequency distortions AmpDist[i, k], PhsDist[i, k] are transferred from the output of the responses measurement unit 14 to a second input of the distortions modification unit 19. The distortions modification unit 19, using data that come to both its inputs, calculates modified frequency distortions to be used as a basis for equalizer coefficients calculation and passes the found arrays through the iteration switch 15 (in the lower position) to the input of the coefficients calculator 17. The coefficients calculator 17 converts the modified frequency distortions into an r-th approximation of the assembly of equalizer coefficients C[i, m] and places these coefficients at its output.

There are two possible ways to end the iterative process of equalizer coefficients calculation. The total number of iterations may be set beforehand so, that after the last iteration the found equalizer coefficients are considered final, calculations stop and the analog-to-digital conversion system transits from the calibration mode into the operating mode. Another possibility is to set a threshold for the residual distortion, and to end the calibration mode when the residual distortions become less than the pre-determined threshold.

FIG. 2 shows the block diagram of the residual distortion calculator 18 in accordance with the illustrated exemplary embodiment of the present invention. The block diagram of FIG. 2 implements the equations (6) and (7), derived in the Appendix.

The amplitude frequency distortions AmpDist[i, k] and the phase frequency distortions PhsDist[i, k], measured by the responses measurement unit 14, arrive at a distortion input of the residual distortion calculator 18 and pass to the inputs of the amplitude-phase to real-imaginary parts converter 21. The amplitude-phase to real-imaginary parts converter 21 produces the real part ReDist[i, k] and the imaginary part ImDist [i, k] of the frequency distortions complex amplitude of the sub-ADC with the number i in accordance with the equations:

ReDist$[i,k]$=AmpDist$[i,k]$·cos(PhsDist$[i,k]$),

ImDist$[i,k]$=AmpDist$[i,k]$·sin(PhsDist$[i,k]$).

The calculations results go to the signals inputs of the FIRs unit 22.

The equalizer coefficients C[i, m] come to the coefficients input of the residual distortion calculator 18 from the output of the coefficients calculator 17 and pass to the input of the coefficients multiplication unit 24. The coefficients multiplication unit 24 produces the sine multiplied coefficients SMC [i, k, m] and cosine multiplied coefficients CMC[i, k, m] in accordance with the equations:

SMC$[i,k,m]$=C$[i, m]$ sin($2\pi km/L$)

CMC$[i,k,m]$=C$[i,m]$ cos($2\pi km/L$).

The calculations results go to the coefficients inputs of the FIRs unit 22.

The FIRs unit 22 carries out the calculation of the correspondent convolutions and combines the intermediate results producing the real ReRes[i, k] and imaginary ImRes[i, k] parts of the residual distortions complex amplitude in accordance with the equations:

$$\text{Re}Res[i, k] = \sum_{m=0}^{L-1} CMC[i, k, m] \cdot \text{Re}Dist[i - m, k] + \sum_{m=0}^{L-1} SMC[i, m] \cdot \text{Im}Dist[i - m, k], \quad (6)$$

$$\text{Im}Res[i, k] = -\sum_{m=0}^{L-1} SMC[i, k, m] \cdot \text{Re}Dist[i - m, k] + \sum_{m=0}^{L-1} CMC[i, m] \cdot \text{Im}Dist[i - m, k]. \quad (7)$$

The real-imaginary parts to amplitude-phase converter 23 receives the real ReRes[i, k] and imaginary ImRes[i, k] parts of the residual distortions complex amplitude from the FIRs unit 22 and forms the residual amplitude distortions AmpRes [i, k] and the residual phase distortions PhsRes[i, k] in accordance with the equations:

AmpRes$[i,k]$=$\sqrt{(\text{Re}Res[i,k]^2+\text{Im}Res[i,k]^2)}$,

PhsRes$[i,k]$=atan(Im$Res[i,k]$/Re$Res[i,k]$).

A block diagram of the FIRs unit 22 in accordance the illustrated exemplary embodiment of the present invention is shown in FIG. 3. The FIRs unit 22 operates in accordance with the equations (6) and (7).

A block diagram of the distortions modification unit 19 in accordance the illustrated exemplary embodiment of the present invention is shown in the FIG. 4. At the iteration #0, the switch 43 is put into the left (as illustrated in FIG. 1) position and the amplitude frequency distortions AmpDist[i, k] and the phase frequency distortions PhsDist[i, k] measured by the responses measurement unit 14, pass through the switch and are written to the memory 42. At this iteration, the output of the distortions modification unit 19 is not used. In the beginning of any next iteration #r, where r>0, the previous modified distortion PrevAmpDistM[i, k] and PrevPhsDistM[i, k] are read from the memory 42 to the input of the modifier 41, and are pre-corrected therein with the use of the residual amplitude distortions AmpRes[i, k] and the residual phase distortions PhsRes[i, k], to produce modified distortions AmpDistM[i, k] and PhsDistM[i, k] according to the following equations:

AmpDistM[i,k]=PrevAmpDistM[i,k]/AmpRes[i,k],

PhsDis'tM[i,k]=PrevPhsDistM[i,k]−PhsRes[i,k].

At the end of the iteration #r, where r>0, the modified distortions AmpDistM[i, k] and PhsDistM[i, k] are advanced to the output of the distortions modification unit 19 and simultaneously are written into the memory 42 to be used (if necessary) during a next iteration.

The experience, accumulated in the use of the interleaved analog to digital converter with digital equalization, shows that two iterations (iteration #0 and iteration #1) during the equalizer coefficients calculation, would usually be sufficient to achieve SFDR (spurious free dynamic range) of the order of 60-65 dBc, so that the calibration calculations may be stopped after two iterations.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

The analog-to-digital conversion system comprises a composite ADC cascaded with a time variant equalizer.

The composite ADC contains N interleaved sub-ADCs. The $i^{th}$ sub-ADC, where $0 \leq i < N$, is characterized by an amplitude frequency response Amp[i, k] and phase frequency response Phs[i, k] (where k, in the range $0 \leq k < L$, is the number of a test frequency at which the responses were measured). The $i^{th}$ transfer function H[i, k] of the sub-ADCs, is H[i,k]=Amp[i,k]exp(j Phs[i,k]).

For an analog signal at the composite ADC input, equivalent to a digital signal x[n]=exp (jank/L), the digital signal y[n] at the ADC output equals $$y[n] = Amp[i, k]\exp(j(2\pi kn/L + Phs[i, k])) \quad (1)$$
$$= .H[i, k]\exp(j2\pi kn/L)$$

The equalizer with the length of L taps is governed by an assembly of coefficients C[i, m]. The assembly of coefficients consists of N sets, a set with a number i being loaded into equalizer when the sample at equalizer input comes from the sub-ADC with the same number. Each set contains L coefficients, one coefficient for one tap. Signal y[n] comes from the output of composite ADC to the input of the equalizer and causes at equalizer output a signal z[n]:

$$z[n] = \sum_{m=0}^{L-1} C[i, m]y[n - m]. \quad (2)$$

For the $i^{th}$ sub-ADC, the sample, created comes to the equalizer input when the sample z[n] appears at the equalizer output.

A substitution of the y[n] from the equation (*) into the equation for z[n] gives:

$$z[n] = \sum_{m=0}^{L-1} C[i, m]H[i - m, k]\exp(j2\pi k(n - m)/L) \quad (3)$$
$$= \exp(j2\pi kn/L)\sum_{m=0}^{L-1} C[i, m]H[i - m, k]\exp(-j2\pi km/L).$$

The complex amplitude Z[i, k] of the signal z[n] equals $$Z[i, k] = \sum_{m=0}^{L-1} C[i, m]H[i - m, k]\exp(-j2\pi km/L). \quad (4)$$

If the cascade connection ADC-equalizer is required to have target transfer function T[k], then the ratio Dist[i, k]=H[i, k]/T[k] describes the initial frequency distortions of the composite ADC, whereas the ratio Res[i, k]=Z[i, k]/T[k] describes the residual frequency distortions of the analog-to-digital conversion system. Dividing both parts of the equation (**) by T[k], gives:

$$Res[i, k] = Z[i, k]/T[k] \quad (5)$$
$$= \sum_{m=0}^{L-1} C[i, m]H[i - m, k]/T[k]\exp(-j2\pi km/L)$$
$$= \sum_{m=0}^{L-1} C[i, m]Dist[i - m, k]\exp(-j2\pi km/L).$$

This equation permits to find the residual frequency distortions Res[i, k] of the analog-to-digital conversion system, where the composite ADC has frequency distortions Dist[i, k] and the equalizer is governed by coefficients assembly C[i, m].

The expressions Dist[i, k] and Res[i, k] are complex numbers. A transfer of those complex numbers to real numbers simplifies the implementation of the last equation. ReDist[i, k] and ImDist[i, k] are the real and imaginary parts of the complex expression Dist[i, k], whereas ReRes[i, k] and ImRes[i, k] are the real and imaginary parts of the complex expression Res[i, k]. Therefore $$Res[i, k] = \text{Re}Res[i, k] + j\text{Im}Res[i, k]$$

$$= \sum_{m=0}^{L-1} C[i, m](\text{Re}Dist[i - m, k] + j\text{Im}Dist[i - m, k])(\cos(2\pi km/L) - j\sin(2\pi km/L))$$

$$= \sum_{m=0}^{L-1} C[i, m](\text{Re}Dist[i - m, k]\cos(2\pi km/L) + \text{Im}Dist[i - m, k]\sin(2\pi km/L) - j\text{Re}Dist[i - m, k]\sin(2\pi km/L) + j\text{Im}Dist[i - m, k]\cos(2\pi km/L)).$$

and $$\text{Re}Res[i, k] = \sum_{m=0}^{L-1} C[i, m]$$
$$(\text{Re}Dist[i - m, k]\cos(2\pi km/L) + \text{Im}Dist[i - m, k]\sin(2\pi km/L)),$$

$$\text{Im}Res[i, k] = \sum_{m=0}^{L-1} C[i, m](-\text{Re}Dist[i - m, k]\sin(2\pi km/L) + \text{Im}Dist[i - m, k]\cos(2\pi km/L)).$$

New expressions may be introduced: sine multiplied coefficients $$SMC[i,k,m] = C[i,m]\sin(2\pi km/L)$$

and cosine multiplied coefficients $$CMC[i,k,m] = C[i,m]\cos(2\pi km/L).$$

Using these expressions, the equations for ReRes[i, k] and ImRes[i, k] may be rewritten as $$\text{Re}Res[i, k] = \quad (6)$$
$$\sum_{m=0}^{L-1}(CMC[i, k, m] \cdot \text{Re}Dist[i - m, k] + SMC[i, m] \cdot \text{Im}Dist[i - m, k]),$$

and $$\text{Im}Res[i, k] = \quad (7)$$
$$\sum_{m=0}^{L-1}(-SMC[i, k, m] \cdot \text{Re}Dist[i - m, k] + CMC[i, m] \cdot \text{Im}Dist[i - m, k]).$$

What is claimed is:

1. An interleaved analog to digital converter with digital equalization, comprising:
   A. a conversion-measurement-equalization unit having:
      i. an analog input, that is used as analog input of the interleaved analog to digital converter with digital equalization, a digital output, that is used as digital output of the interleaved analog to digital converter with digital equalization,
      ii. a measured frequency responses output, a corrected frequency responses input and
      iii. an equalizer coefficients output, said conversion-measurement-equalization unit being able to work in a calibration mode or an operational mode, wherein in the operational mode the conversion-measurement-equalization unit converts the input analog signal into a digital signal by the use of a interleaved composite ADC consisting of N sub-ADCs, corrects sub-ADCs misalignment as well as the deviations from target frequency responses by the use of a digital equalizer and puts equalizer output signal at the digital output of the conversion-measurement-equalization unit, whereas in the calibration mode said conversion-measurement-equalization unit performs frequency responses measurement of each sub-ADC and yields the measurement results on the measured frequency responses output, transforms the corrected frequency responses received at its corrected frequency responses input into a set of equalizer coefficients, puts them at the equalizer coefficients output and loads the coefficients into digital equalizer memory;
   B. a residual distortions reduction unit having:
      i. a measured frequency responses input connected to the measured frequency responses output of the conversion-measurement-equalization unit,
      ii. an equalizer coefficients input connected to the equalizer coefficients output of the conversion-measurement-equalization unit and
      iii. a corrected frequency responses output connected to the corrected frequency responses input of the conversion-measurement-equalization unit, wherein said residual distortions reduction unit uses received measured frequency responses and equalizer coefficients as a base to calculate the corrected frequency responses, the calculations being performed as a set of successive iterations.

2. An interleaved analog to digital converter with digital equalization as in claim 1, wherein the residual distortions reduction unit comprises:
   A. a residual distortions calculator for calculating the residual frequency distortions that should have been expected to appear in the output signal of the interleaved analog to digital converter with digital equalization if current coefficients set had been loaded into the equalizer, said residual distortions calculator having:
      i. an equalizer coefficients input connected to the equalizer coefficients input of the residual distortions reduction unit,
      ii. a measured frequency responses input connected to the measured frequency responses input of the residual distortions reduction unit and
      iii. an output;
      iv. a distortions modification unit for calculation of the corrected frequency responses to be used as a basis for equalizer coefficients calculation during the current iteration, said distortions modification unit being used in all iterations except the zero iteration and having
         a. a measured frequency responses input,
         b. a residual distortions input and
         c. an output, whereas the measured frequency responses input of the distortions modification unit is connected to the measured frequency responses input of residual distortions reduction unit, while the residual distortions input of the distortions modification unit is connected to the output of the residual distortions calculator; and
   B. an iteration switch for connecting the corrected frequency responses output of residual distortions reduction unit to the measured frequency responses input of residual distortions reduction unit at the zero iteration or to the output of the distortions modification unit during all other iterations.

3. An interleaved analog to digital converter with digital equalization as in claim 2, wherein the residual distortions calculator comprises:
   A. an amplitude-phase to real-imaginary parts converter for transforming the amplitude and phase frequency distortions of each sub-ADC into the real part and the imaginary part of the frequency distortions complex amplitude of the same sub-ADC, the amplitude-phase to real-imaginary parts converter having an input that is used as the distortions input of the residual distortions calculator and an output;

B. a coefficients multiplication unit for producing sine multiplied equalizer coefficients and cosine multiplied equalizer coefficients, said coefficients multiplication unit having an input that is used as the current coefficients input of the residual distortions calculator and an output;

C. a FIRs unit for producing the real part and the imaginary part of the residual distortions complex amplitude, said FIRs unit having a distortions input, a multiplied coefficients input and an output, whereas the distortions input of the FIRs unit is connected to the output of the amplitude-phase to real-imaginary parts converter and the multiplied coefficients input of the FIRs unit is connected to the output of the coefficients multiplication unit;

D. a real-imaginary parts to amplitude-phase converter for transforming the real part and the imaginary part of the residual distortions complex amplitude into the residual frequency distortions that should have been expected to appear in the output signal of the interleaved analog to digital converter with digital equalization, if current coefficients assembly had been loaded into the equalizer, said real-imaginary parts to amplitude-phase converter having an input that is connected to the output of the FIRs unit and an output that is used as the output of the residual distortions calculator.

4. An interleaved analog to digital converter with digital equalization as in claim 3, wherein the distortions modification unit comprises:

A. a modifier for producing modified frequency distortions of the sub-ADCs to be used as a basis for equalizer coefficients calculation, said modifier having a residual distortions input, a previously modified distortions input and an output, whereas the residual distortions input of the modifier is used as the distortions input of the distortions modification unit and the output of the modifier is used as the output of the distortions modification unit;

B. a memory for storing the modified frequency distortions of the sub-ADCs produced in the previous iteration, said memory having a write input and a read output that is connected to the previously modified distortions input of the modifier;

C. a switch for connecting the write input of the memory to the distortions input of the distortions modification unit at the zero iteration and to the output of the modifier during all other iterations.

* * * * *